(12) United States Patent
Kim et al.

(10) Patent No.: US 11,551,588 B2
(45) Date of Patent: Jan. 10, 2023

(54) DISPLAY DEVICE

(71) Applicant: Samsung Display Co., Ltd., Yongin-si (KR)

(72) Inventors: Jong Hee Kim, Yongin-si (KR); Il-Joo Kim, Hwaseong-si (KR); Sang-Uk Lim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 151 days.

(21) Appl. No.: 17/194,872

(22) Filed: Mar. 8, 2021

(65) Prior Publication Data

US 2021/0192990 A1 Jun. 24, 2021

Related U.S. Application Data

(63) Continuation of application No. 16/139,419, filed on Sep. 24, 2018, now Pat. No. 10,943,515.

(30) Foreign Application Priority Data

Feb. 26, 2018 (KR) .......................... 10-2018-0022750

(51) Int. Cl.
*G09F 9/33* (2006.01)
*G09G 3/32* (2016.01)
*H01L 25/075* (2006.01)
*G09G 3/20* (2006.01)

(52) U.S. Cl.
CPC .............. *G09F 9/33* (2013.01); *G09G 3/2003* (2013.01); *G09G 3/32* (2013.01); *H01L 25/0753* (2013.01); *G09G 2300/0426* (2013.01)

(58) Field of Classification Search
CPC ............ G09F 9/33; G09G 3/2003; G09G 3/32
See application file for complete search history.

(56) References Cited

U.S. PATENT DOCUMENTS

| 9,990,883 | B2 | 6/2018 | Park et al. |
|---|---|---|---|
| 10,769,999 | B2 | 9/2020 | Park et al. |
| 2004/0095298 | A1 | 5/2004 | Miyazawa |
| 2007/0206011 | A1 | 9/2007 | Han et al. |
| 2010/0013816 | A1 | 1/2010 | Kwak |
| 2017/0124953 | A1 | 5/2017 | Shim |

(Continued)

FOREIGN PATENT DOCUMENTS

| CN | 101441356 | 5/2009 |
|---|---|---|
| CN | 109671395 | 4/2019 |

(Continued)

*Primary Examiner* — Marvin Payen
(74) *Attorney, Agent, or Firm* — Kile Park Reed & Houtteman PLLC

(57) ABSTRACT

A display device includes: a first pixel including a first light emitting diode (LED) and a first capacitor including a first electrode connected to a first power source voltage providing a driving voltage to an anode of the first light emitting diode (LED) or to an initialization voltage, and a second electrode connected to the anode of the first light emitting diode (LED); and a second pixel including a second light emitting diode (LED) and a second capacitor including a first electrode connected to the first power source voltage providing the driving voltage to an anode of the second light emitting diode (LED) or to an initialization voltage, and a second electrode connected to the anode of the second light emitting diode (LED), wherein capacitance of the second capacitor is less than capacitance of the first capacitor.

19 Claims, 17 Drawing Sheets

(56) References Cited

U.S. PATENT DOCUMENTS

| | | | |
|---|---|---|---|
| 2017/0169764 A1 | 6/2017 | Lee et al. | |
| 2018/0005601 A1 | 1/2018 | Kim et al. | |
| 2020/0365086 A1 | 11/2020 | Park et al. | |
| 2022/0199026 A1 | 6/2022 | Park et al. | |

FOREIGN PATENT DOCUMENTS

| | | |
|---|---|---|
| KR | 10-0836430 | 6/2008 |
| KR | 10-2015-0002324 | 1/2015 |
| KR | 10-2015-0067904 | 6/2015 |
| KR | 10-2016-0074780 | 6/2016 |
| KR | 10-2016-0129186 | 11/2016 |
| KR | 10-2017-0019547 | 2/2017 |
| KR | 10-2017-0026763 | 3/2017 |
| KR | 10-2017-0026971 | 3/2017 |
| KR | 10-2017-0052776 | 5/2017 |
| KR | 10-2017-0110211 | 10/2017 |

DISPLAY DEVICE

CROSS-REFERENCE TO RELATED APPLICATION(S)

This is a continuation application of U.S. patent application Ser. No. 16/139,419 filed Sep. 24, 2018 (now pending), the disclosure of which is incorporated herein by reference in its entirety. U.S. patent application Ser. No. 16/139,419 claims priority benefit of Korean Patent Application 10-2018-0022750 filed Feb. 26, 2018 in the Korean Intellectual Property Office, the disclosure of which is incorporated herein by reference in its entirety for all purposes.

BACKGROUND

1. Field

Embodiments relate to a display device, more particularly, to a display device using a pixel including a light emitting diode (LED).

2. Description of the Related Art

A display device includes a plurality of pixels for displaying an image, and a plurality of gate lines and a plurality of data lines connected to the plurality of pixels. The display device sequentially applies a gate signal to the plurality of gate lines and applies a data voltage to the plurality of data lines according to the gate signal.

SUMMARY

A display device according to an exemplary embodiment includes: a first pixel including a first light emitting diode (LED) and a first capacitor including a first electrode connected to a first power source voltage providing a driving voltage to an anode of the first light emitting diode (LED) and a second electrode connected to the anode of the first light emitting diode (LED); and a second pixel including a second light emitting diode (LED) and a second capacitor including a first electrode connected to the first power source voltage providing the driving voltage to an anode of the second light emitting diode (LED) and a second electrode connected to the anode of the second light emitting diode (LED), wherein capacitance of the second capacitor is less than capacitance of the first capacitor.

The second light emitting diode (LED) may emit green light, and the first light emitting diode (LED) may emit red light or blue light.

A third pixel including a third light emitting diode (LED) and a third capacitor including a first electrode connected to the first power source voltage providing the driving voltage to the anode of the third light emitting diode (LED) and a second electrode directly connected to the anode of the third light emitting diode (LED) may be further included, and the capacitance of the second capacitor may be less than the capacitance of the third capacitor.

The first light emitting diode (LED) may emit red light, the second light emitting diode (LED) may emit green light, and the third light emitting diode (LED) may emit blue light.

The capacitance of the first capacitor may be less than the capacitance of the third capacitor.

A third pixel including a third light emitting diode (LED) having no capacitor connected to the first power source voltage, wherein the first pixel emits red light, the second pixel emits blue light, and the third pixel emits green light.

A display device according to another exemplary embodiment may include: a first pixel including a first light emitting diode (LED) connected between a first power source voltage and a second power source voltage and a first capacitor connected between an anode of the first light emitting diode (LED) and an initialization voltage; and a second pixel including a second light emitting diode (LED) connected between the first power source voltage and the second power source voltage and a second capacitor connected between the anode of the second light emitting diode (LED) and the initialization voltage, wherein capacitance of the second capacitor is less than capacitance of the first capacitor.

The second light emitting diode (LED) may emit green light, and the first light emitting diode (LED) may emit red light or blue light.

A third pixel including a third light emitting diode (LED) connected between the first power source voltage and the second power source voltage and a third capacitor connected between the anode of the third light emitting diode (LED) and the initialization voltage may be further included, and the capacitance of the second capacitor may be less than the capacitance of the third capacitor.

The first light emitting diode (LED) may emit red light, the second light emitting diode (LED) may emit green light, and the third light emitting diode (LED) may emit blue light.

The capacitance of the first capacitor may be less than the capacitance of the third capacitor.

A third pixel may include a third light emitting diode (LED) having no capacitor connected to the initialization voltage, wherein the first pixel emits red light, the second pixel emits blue light, and the third pixel emits green light A display device according to another exemplary embodiment may include a plurality of pixels, wherein the plurality of pixels include a light emitting diode (LED) having a parasitic capacitor, and a pixel circuit for controlling a current flowing from a first power source voltage to the light emitting diode (LED), a first pixel that includes a first capacitor connected to an anode of the light emitting diode (LED), and a second pixel that does not include a capacitor connected to an anode of the light emitting diode (LED).

The second pixel may emit green light, and the first pixel may emit red light or blue light.

The first capacitor may include a first electrode connected to the first power source voltage and a second electrode connected to the anode of the light emitting diode (LED).

The first capacitor may include a first electrode connected to the initialization voltage and a second electrode connected to the anode of the light emitting diode (LED).

A third pixel may include a third capacitor connected to the anode of the light emitting diode (LED), and the capacitance of the first capacitor may be less than the capacitance of the third capacitor.

The first pixel may emit red light, the second pixel may emit green light, and the third pixel may emit blue light.

The pixel circuit may include: a driving transistor connected between the first power source voltage and the light emitting diode (LED) and controlling the current flowing from the first power source voltage to the light emitting diode (LED); a first emission control transistor connected between the first power source voltage and the driving transistor; and a second emission control transistor connected between the driving transistor and the light emitting diode (LED).

The first capacitor may include a first electrode connected to the first power source voltage and a second electrode connected between the second emission control transistor and the light emitting diode (LED).

The first capacitor may include a first electrode connected to the initialization voltage, and a second electrode connected between the second emission control transistor and the light emitting diode (LED).

The first capacitor may include a first electrode connected to the first power source voltage, and a second electrode connected between the driving transistor and the second emission control transistor.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
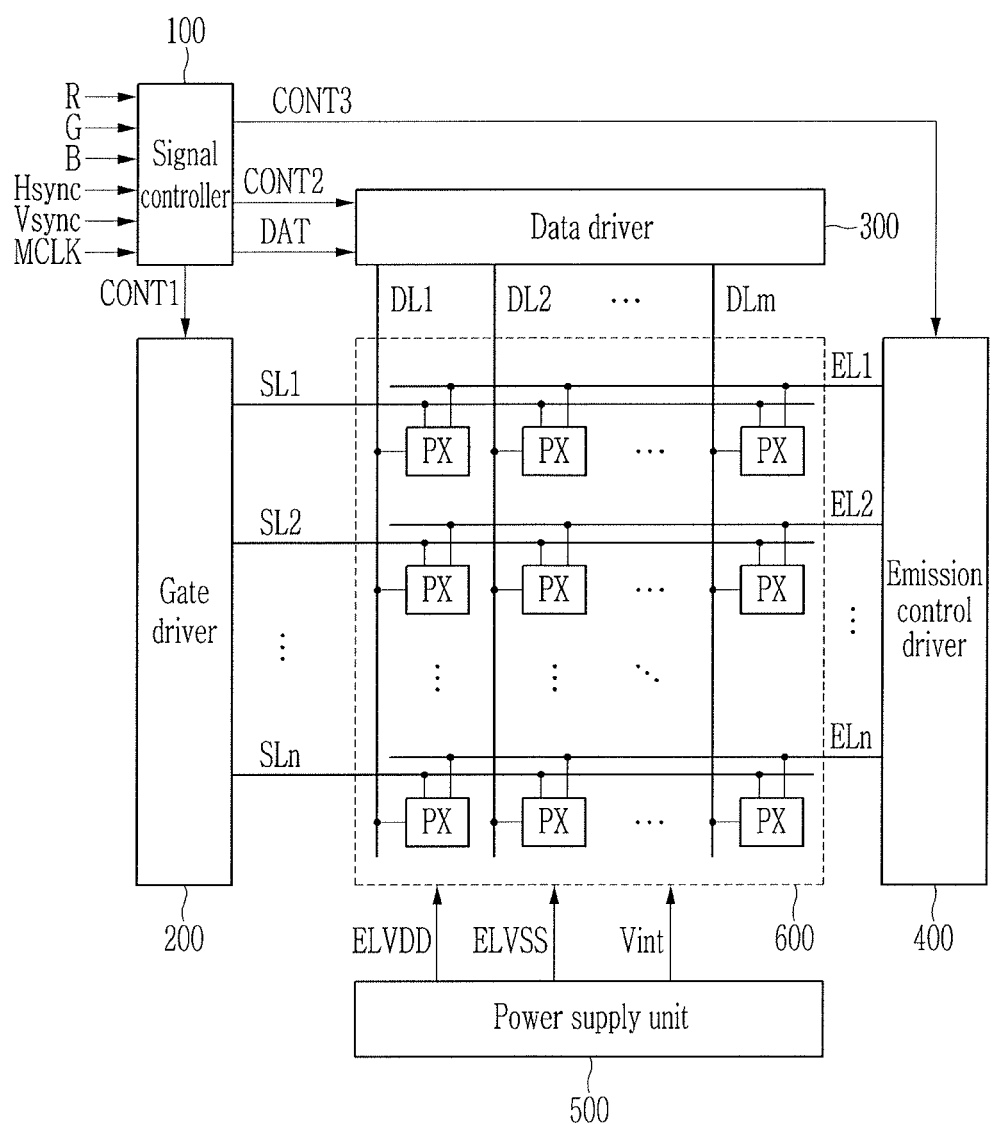
FIG. 1 illustrates a block diagram of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Parts that are irrelevant to the description will be omitted to clearly describe embodiments, and like reference numerals designate like elements throughout the specification. In addition, unless explicitly described to the contrary, the word "comprise" and variations such as "comprises" or "comprising" will be understood to imply the inclusion of stated elements but not the exclusion of any other elements.

FIG. 1 is a block diagram showing a display device according to an exemplary embodiment. Referring to FIG. 1, the display device includes a signal controller 100, a gate driver 200, a data driver 300, an emission control driver 400, a power supply unit 500, and a display unit 600.

The signal controller 100 receives image signals R, G, and B, and input control signals for controlling the image signals R, G, and B from an external device. The image signals R, G, and B store luminance information having a predetermined number of gray levels of each pixel PX. Examples of the input control signals include a data enable signal DE, a horizontal synchronizing signal Hsync, a vertical synchronization signal Vsync, a main clock signal MCLK, and the like.

The signal controller 100 appropriately processes the input image signals R, G, and B in accordance with operation conditions of the display unit 600 and the input control signals, and generates a first control signal CONT1, a second control signal CONT2, an image data signal DAT, and a third control signal CONT3. The signal controller 100 transmits the first control signal CONT1 to the gate driver 200, the second control signal CONT2 and the image data signal DAT to the data driver 300, and the third control signal CONT3 to the emission control driver 400.

The display unit 600 includes a plurality of gate lines SL1-SLn, a plurality of data lines DL1-DLm, a plurality of emission control lines EL1-ELn, and a plurality of pixels PX. The plurality of pixels PX are connected to the plurality of gate lines SL1-SLn, the plurality of data lines DL1-DLm, and the plurality of emission control lines EL1-ELn, and may be arranged in a matrix. The plurality of gate lines SL1-SLn may extend in an approximate row direction and may be parallel to each other. The plurality of emission control lines EL1-ELn may extend in the approximate row direction and may be parallel to each other. The plurality of data lines DL1-DLm may extend in an approximate column direction and may be parallel to each other.

The gate driver 200 is connected to the plurality of gate lines SL1-SLn, and transmits a gate signal made of a combination of a gate-on voltage and a gate-off voltage to the plurality of gate lines SL1-SLn according to the first control signal CONT1. The gate driver 200 may sequentially apply the gate signal of the gate-on voltage to the plurality of gate lines SL1-SLn.

The data driver 300 is connected to the plurality of data lines DL1-DLm, samples and holds the image data signal DAT according to the second control signal CONT2, and applies the data voltage to the plurality of data lines DL1-DLm. The data driver 300 may apply the data voltage having a predetermined voltage range to the plurality of data lines DL1-DLm in accordance with the gate signal of the gate-on voltage.

The emission control driver 400 is connected to the plurality of emission control lines EL1-ELn, and may apply an emission control signal made of a combination of the gate-on voltage and the gate-off voltage to the plurality of emission control lines EL1-ELn according to the third control signal CONT3. According to an exemplary embodiment, a configuration of the plurality of pixels PX may be variously changed, and the emission control driver 400 and the plurality of emission control lines EL1-ELn may be omitted according to the configuration of the plurality of pixels PX.

The power supply unit 500 supplies a first power source voltage ELVDD and a second power source voltage ELVSS to the plurality of pixels PX. According to the configuration of the plurality of pixels PX, the power supply unit 500 may further supply an initialization voltage Vint to the plurality of pixels PX. The first power source voltage ELVDD may be a high level voltage provided to an anode of the light emitting diode (LED) included in each of the plurality of pixels PX. The second power source voltage ELVSS may be a low level voltage provided to a cathode of the light emitting diode (LED) included in each of the plurality of pixels PX. The first power source voltage ELVDD and the second power source voltage ELVSS are driving voltages to emit the plurality of pixels PX. The initialization voltage Vint to initialize or reset the pixel PX may be a voltage of a different level from the second power source voltage ELVSS.

Each of the plurality of pixels PX may be pixels that emit one color of light among primary colors, e.g., red, green, and blue or yellow, cyan, and magenta. Hereinafter, the pixels will be described as emitting one of red, green, and blue light. The pixel emitting the red light is referred to as a first pixel, the pixel emitting the green light is referred to as a second pixel, and the pixel emitting the blue light is referred to as a third pixel. The first pixel, the second pixel, and the third pixel may together emit white light.

Figure 2:
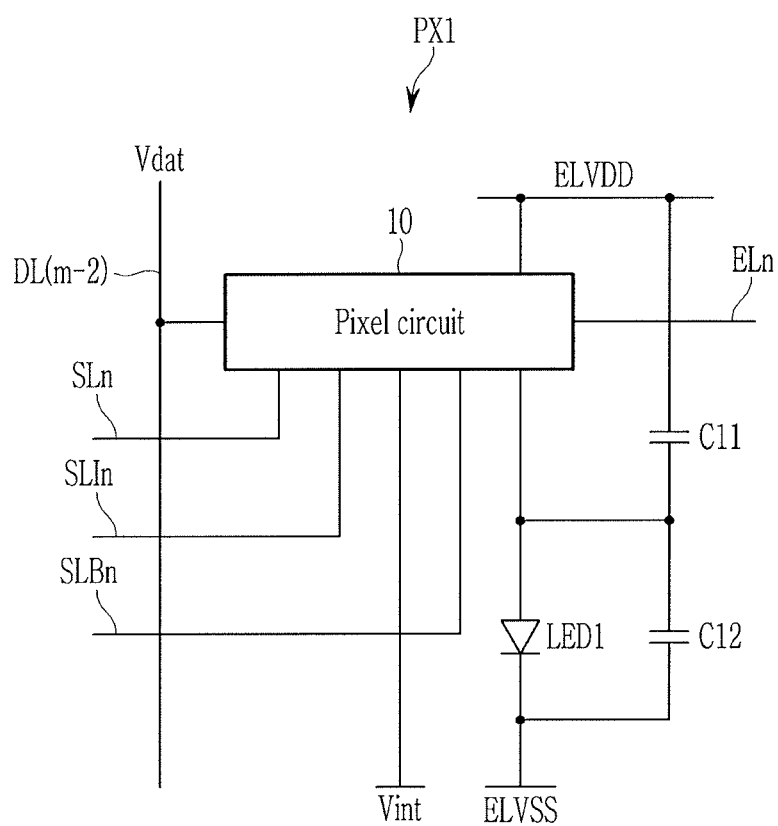
FIG. 2 illustrates a view of a first pixel according to an exemplary embodiment.
Figure 3:
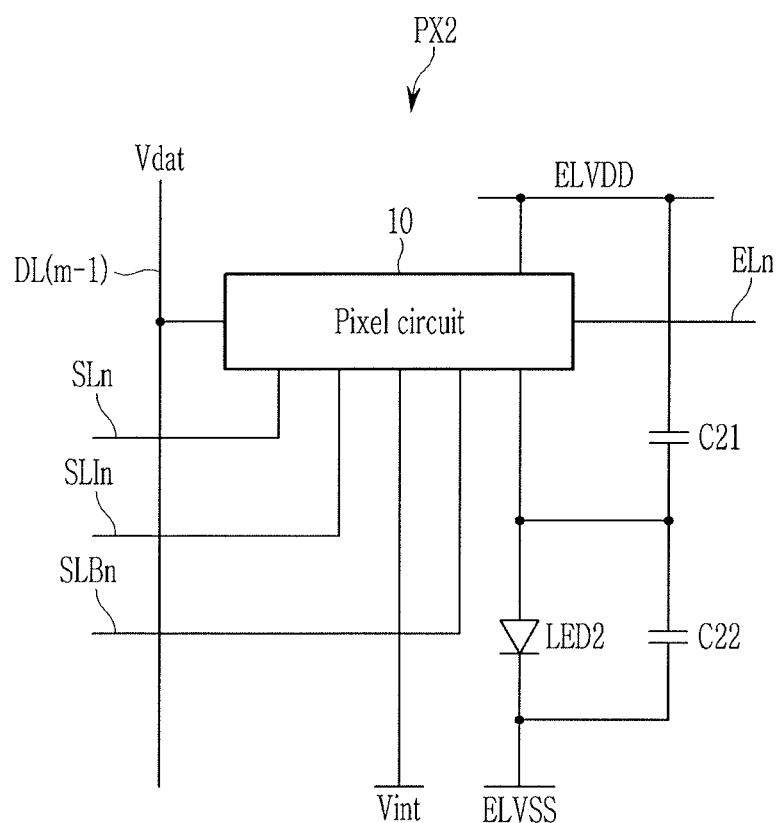
FIG. 3 illustrates a view of a second pixel according to an exemplary embodiment.
Figure 4:
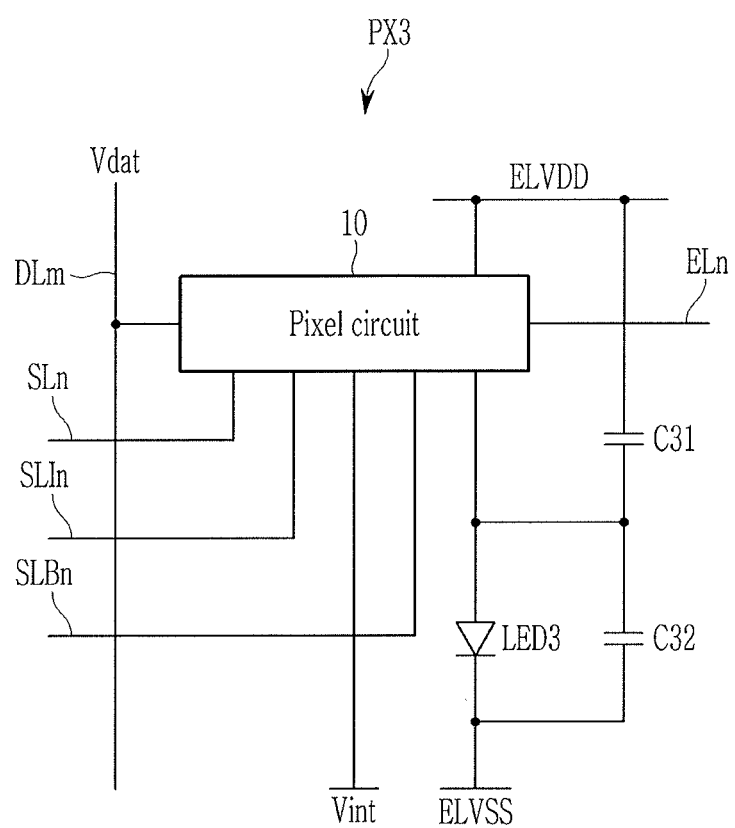
FIG. 4 illustrates a view of a third pixel according to an exemplary embodiment.

Next, the first pixel, the second pixel, and the third pixel according to an exemplary embodiment are described with reference to FIG. 2 to FIG. 4. FIG. 2 is a view showing a first pixel PX1 according to an exemplary embodiment. FIG. 3 is a view showing a second pixel PX2 according to an exemplary embodiment. FIG. 4 is a view showing a third pixel PX3 according to an exemplary embodiment.

Referring to FIG. 2, the first pixel PX1 at an n-th pixel row and an (m−2)-th pixel column in the display device of FIG. 1 is described as an example. The first pixel PX1 includes a first light emitting diode (LED) LED1, a pixel circuit 10, and a first capacitor C11.

A first gate line SLn, a second gate line SLIn, a third gate line SLBn, a first data line DL(m−2), and an emission control line ELn may be connected to the pixel circuit 10. The pixel circuit 10 may control the current flowing from the first power source voltage ELVDD to the first light emitting diode (LED) LED1 by corresponding to the data voltage Vdat applied through the first data line DL(m−2). The second gate line SLIn may be the gate line before one pixel row from the first gate line SLn. The third gate line SLBn may be the gate line before the second gate line SLIn by one pixel row, or the same pixel row as the second gate line SLIn, or the gate line positioned at the same pixel row as the first gate line SLn. Alternatively, at least one among the second gate line SLIn, the third gate line SLBn, and the emission control line ELn may be omitted, as described in detail later.

The first light emitting diode (LED) LED1 includes an anode connected to the pixel circuit 10 and a cathode connected to the second power source voltage ELVSS. The first light emitting diode (LED) LED1 is connected between the pixel circuit 10 and the second power source voltage ELVSS, thereby emitting light with the luminance corresponding to the current supplied from the pixel circuit 10. The first light emitting diode (LED) LED1 may include an emission layer including at least one of an organic emission material and an inorganic emission material. Holes and electrons are injected to the organic emission layer from the anode and the cathode, and light is emitted when excitons, resulting from recombination of the injected holes and electrodes, drop from an excited state to a ground state.

The first light emitting diode (LED) LED1 may emit the red light. The first light emitting diode (LED) LED1 may have a first parasitic capacitor C12. The first parasitic capacitor C12 may include a first electrode connected to the anode of the first light emitting diode (LED) LED1 and a second electrode connected to the cathode of the first light emitting diode (LED) LED1.

The first capacitor C11 includes a first electrode connected to the first power source voltage ELVDD and a second electrode connected to the anode of the first light emitting diode (LED) LED1. The first electrode of the first capacitor C11 may be directly connected to the first power source voltage ELVDD, and the second electrode of the first capacitor C11 may be directly connected to the anode of the first light emitting diode (LED) LED1.

The first capacitor C11 may control the emission timing of the first light emitting diode (LED) LED1 when the current begins to flow to the first light emitting diode (LED) LED1 through the pixel circuit 10. That is, when the current begins to flow to the first light emitting diode (LED) LED1 through the pixel circuit 10, the time that the anode voltage of the first light emitting diode (LED) LED1 reaches the threshold voltage may be delayed by the time that it takes for the first capacitor C11 to be charged. Accordingly the emission timing of the first light emitting diode (LED) LED1 may be delayed. The emission timing of the first light emitting diode (LED) LED1 may be determined according to the capacitance of the first capacitor C11.

Referring to FIG. 3, the second pixel PX2 at the n-th pixel row and the (m−1)-th pixel column among the plurality of pixels PX included in the display device of FIG. 1 is described as an example. Differences are mainly described compared with FIG. 2. The second pixel PX2 includes a second light emitting diode (LED) LED2, the pixel circuit 10, and a second capacitor C21.

The first gate line SLn, the second gate line SLIn, the third gate line SLBn, the second data line DL (m−1), and the emission control line ELn are connected to the pixel circuit 10. The pixel circuit 10 may control the current flowing from the first power source voltage ELVDD to the second light emitting diode (LED) LED2 by corresponding to the data voltage Vdat applied through the first data line DL(m−1). The configuration of the pixel circuit 10 of FIG. 3 may be the same as, including variations thereon, the configuration of the pixel circuit 10 of FIG. 2.

The second light emitting diode (LED) LED2 includes an anode connected to the pixel circuit 10 and a cathode connected to the second power source voltage ELVSS. The second light emitting diode (LED) LED2 is connected between the pixel circuit 10 and the second power source voltage ELVSS, thereby emitting light with a luminance corresponding to the current supplied from the pixel circuit 10. The second light emitting diode (LED) LED2 may emit green light. The second light emitting diode (LED) LED2 may have a second parasitic capacitor C22. The second parasitic capacitor C22 may include the first electrode connected to an anode of the second light emitting diode (LED) LED2 and a second electrode connected to the cathode of the second light emitting diode (LED) LED2.

The second capacitor C21 includes the first electrode connected to a first power source voltage ELVDD and a second electrode connected to the anode of the second light emitting diode (LED) LED2. The first electrode of the second capacitor C21 may be directly connected to the first power source voltage ELVDD, and the second electrode of the second capacitor C21 may be directly connected to the anode of the second light emitting diode (LED) LED2.

The second capacitor C21 may control the emission timing of the second light emitting diode (LED) LED2 when the current begins to flow to the second light emitting diode (LED) LED2 through the pixel circuit 10. That is, when the current begins to flow to the second light emitting diode (LED) LED2 through the pixel circuit 10, the time that the anode voltage of the second light emitting diode (LED) LED2 reaches the threshold voltage may be delayed by the time that it takes for the second capacitor C21 to be charged. Accordingly, the emission timing of the second light emitting diode (LED) LED2 may be delayed. The emission timing of the second light emitting diode (LED) LED2 may be determined according to the capacitance of the second capacitor C21.

Referring to FIG. 4, the third pixel PX3 at the n-th pixel row and the m-th pixel column among the plurality of pixels PX included in the display device of FIG. 1 is described as an example. Differences are mainly described compared with FIG. 2. The third pixel PX3 includes a third light emitting diode (LED) LED3, the pixel circuit 10, and a third capacitor C31.

The first gate line SLn, the second gate line SLIn, the third gate line SLBn, the third data line DLm, and the emission control line ELn may be connected to the pixel circuit 10. The pixel circuit 10 may control the current flowing from the first power source voltage ELVDD to the third light emitting diode (LED) LED3 by corresponding to the data voltage Vdat applied through the third data line DLm. The configuration of the pixel circuit 10 of FIG. 4 may be the same as, including variations thereof, of the pixel circuit 10 of FIG. 2.

The third light emitting diode (LED) LED3 includes the anode connected to the pixel circuit 10 and the cathode connected to the second power source voltage ELVSS. The third light emitting diode (LED) LED3 is connected between the pixel circuit 10 and the second power source voltage ELVSS, thereby being emitted with the luminance corresponding to the current supplied from the pixel circuit 10. The third light emitting diode (LED) LED3 may emit the blue light. The third light emitting diode (LED) LED3 may have a third parasitic capacitor C32. The third parasitic capacitor C32 may include a first electrode connected to the anode of the third light emitting diode (LED) LED3 and a second electrode connected to the cathode of the third light emitting diode (LED) LED3.

The third capacitor C31 includes a first electrode connected to the first power source voltage ELVDD and a second electrode connected to the anode of the third light emitting diode (LED) LED3. The first electrode of the third capacitor C31 may be directly connected to the first power source voltage ELVDD, and the second electrode of the third capacitor C31 may be directly connected to the anode of the third light emitting diode (LED) LED3.

The third capacitor C31 may control the emission timing of the third light emitting diode (LED) LED3 when the current begins to flow to the third light emitting diode (LED) LED3 through the pixel circuit 10. That is, when the current begins to flow to the third light emitting diode (LED) LED3 through the pixel circuit 10, the time that the anode voltage of the third light emitting diode (LED) LED3 reaches the threshold voltage may be delayed by the time that it takes for the third capacitor C31 to be charged. Accordingly the emission timing of the third light emitting diode (LED) LED3 may be delayed. The emission timing of the third light emitting diode (LED) LED3 may be determined according to the capacitance of the third capacitor C31.

Referring to FIG. 2 to FIG. 4, the capacitance of the second capacitor C21 of the second pixel PX2 is less than the capacitance of the first capacitor C11 of the first pixel PX1. Also, the capacitance of the second capacitor C21 of the second pixel PX2 is less than the capacitance of the third capacitor C31 of the third pixel PX3. The capacitance of the first capacitor C11 of the first pixel PX1 may be less than the capacitance of the third capacitor C31 of the third pixel PX3.

The amount of current provided to the second light emitting diode (LED) LED2 of the second pixel PX2 having the excellent emission efficiency is relatively small compared with the first light emitting diode (LED) LED1 or the third light emitting diode (LED) LED3. Accordingly, the time taken to charge the second parasitic capacitor C22 of the second light emitting diode (LED) LED2 may be longer than the time taken to charge the first parasitic capacitor C12 of the first light emitting diode (LED) LED1 and the third parasitic capacitor C32 of the third light emitting diode (LED) LED3. However, because the capacitance of the second capacitor C21 is less than the capacitance of the first capacitor C11 and the capacitance of the third capacitor C31, the time taken to charge the second capacitor C21 may be shorter than the time taken to charge the first capacitor C11 and the third capacitor C31. The time that the anode voltage of the first light emitting diode (LED) LED1 reaches the threshold voltage is determined by the capacitance of the first parasitic capacitor C12 and the first capacitor C11. Also, the time that the anode voltage of the second light emitting diode (LED) LED2 reaches the threshold voltage is determined by the capacitance of the second parasitic capacitor C22 and the second capacitor C21. Further, the time that the anode voltage of the third light emitting diode (LED) LED3 reaches the threshold voltage is determined by the capacitance of the third parasitic capacitor C32 and the third capacitor C31.

Accordingly, by appropriately controlling the capacitance of the first capacitor C11 and the second capacitor C21, the emission timing of the second light emitting diode (LED) LED2 of which the anode voltage reaches the threshold voltage and the emission timing of the first light emitting diode (LED) LED1 of which the anode voltage reaches the threshold voltage may be matched. Also, by appropriately controlling the capacitance of the second capacitor C21 and the third capacitor C31, the emission timing of the second light emitting diode (LED) LED2 of which the anode voltage reaches the threshold voltage and the emission timing of the third light emitting diode (LED) LED3 of which the anode voltage reaches the threshold voltage may be matched. That is, the emission timing of the second pixel PX2 may be matched with the emission timing of the first pixel PX1 and the third pixel PX3.

Additionally, the emission efficiency of the third light emitting diode (LED) LED3 of the third pixel PX3 may be better than that of the first light emitting diode (LED) LED1 of the first pixel PX1. Accordingly, an amount of current provided to the first light emitting diode (LED) LED1 may be relatively small compared with the third light emitting diode (LED) LED3. The time taken for charging the first parasitic capacitor C12 of the light emitting diode (LED) LED1 may be longer than that of the third parasitic capacitor C32 of the third light emitting diode (LED) LED3. However, by appropriately controlling the capacitance of the first capacitor C11 to be less than the capacitance of the third capacitor C31, the emission timing of the first light emitting diode (LED) LED1 of which the anode voltage reaches the threshold voltage and the emission timing of the third light emitting diode (LED) LED3 of which the anode voltage reaches the threshold voltage may be matched. That is, the emission timing of the first pixel PX1 and the emission timing of the third pixel PX3 may be matched.

As described above, as the emission timings of the first pixel PX1, the second pixel PX2, and the third pixel PX3 are matched with each other, a color distortion phenomenon in which a white image appears as purple or magenta may be prevented.

Figure 5:
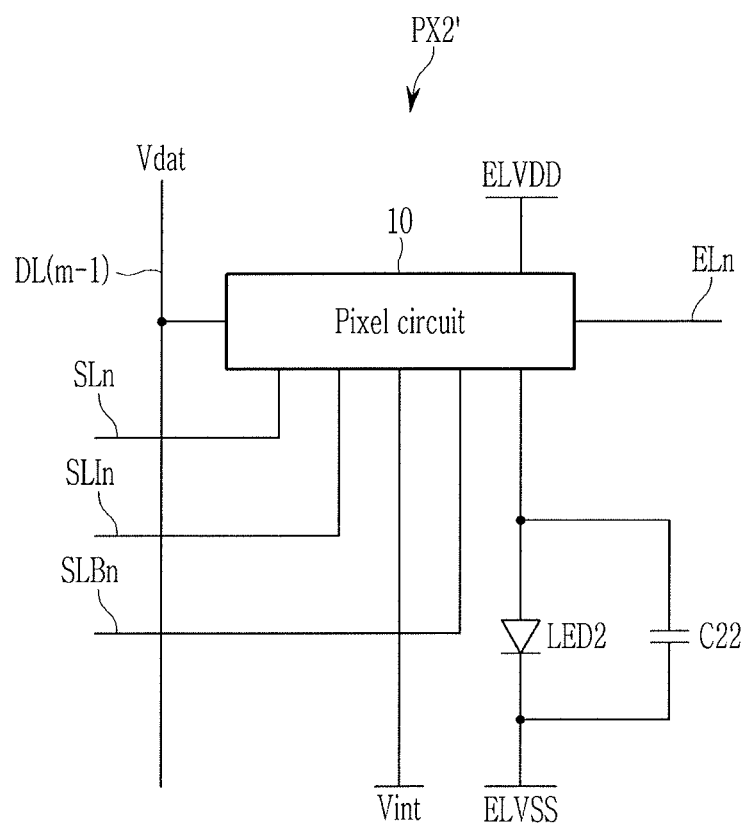
FIG. 5 illustrates a view of a second pixel according to another exemplary embodiment.

Next, a second pixel PX2' according to another exemplary embodiment is described with reference to FIG. 5. Differences are mainly described compared with the second pixel PX2 of FIG. 3. FIG. 5 is a view showing a second pixel according to another exemplary embodiment.

Compared with FIG. 3, the second pixel PX2' of FIG. 5 does not include the second capacitor C21. That is, the plurality of pixels PX included in the display device may include the first pixel PX1 including the first capacitor C11 of FIG. 2, the second pixel PX2' of FIG. 5, and the third pixel PX3 including the third capacitor C31 of FIG. 4.

In this case, the capacitance of the first capacitor C11 may be determined so that the emission timing of the first light emitting diode (LED) LED1 is matched with the emission timing of the second light emitting diode (LED) LED2. Accordingly the emission timings of the first pixel PX1 and the second pixel PX2 may be matched. Also, the capacitance of the third capacitor C31 may be determined so that the emission timing of the third light emitting diode (LED) LED3 is matched with the emission timing of the second light emitting diode (LED) LED2. Accordingly the emission timings of the third pixel PX3 and the second pixel PX2 may be matched. As described above, as the emission timings of the first pixel PX1, the second pixel PX2, and the third pixel PX3 are matched with each other, a color distortion phenomenon in which a white image appears as purple or magenta may be prevented.

Next, exemplary embodiments of the pixel circuit 10 included in FIG. 2 to FIG. 5 are described with reference to FIG. 6 to FIG. 8. The pixel circuit 10 is described as an example of the first pixel PX1. The pixel circuit 10 included in the second pixel (PX2, PX2') and the third pixel PX3 is the same as the pixel circuit 10 of the first pixel PX1 such that the description for the pixel circuit 10 included in the second pixel (PX2, PX2') and the third pixel PX3 is omitted.

Figure 6:
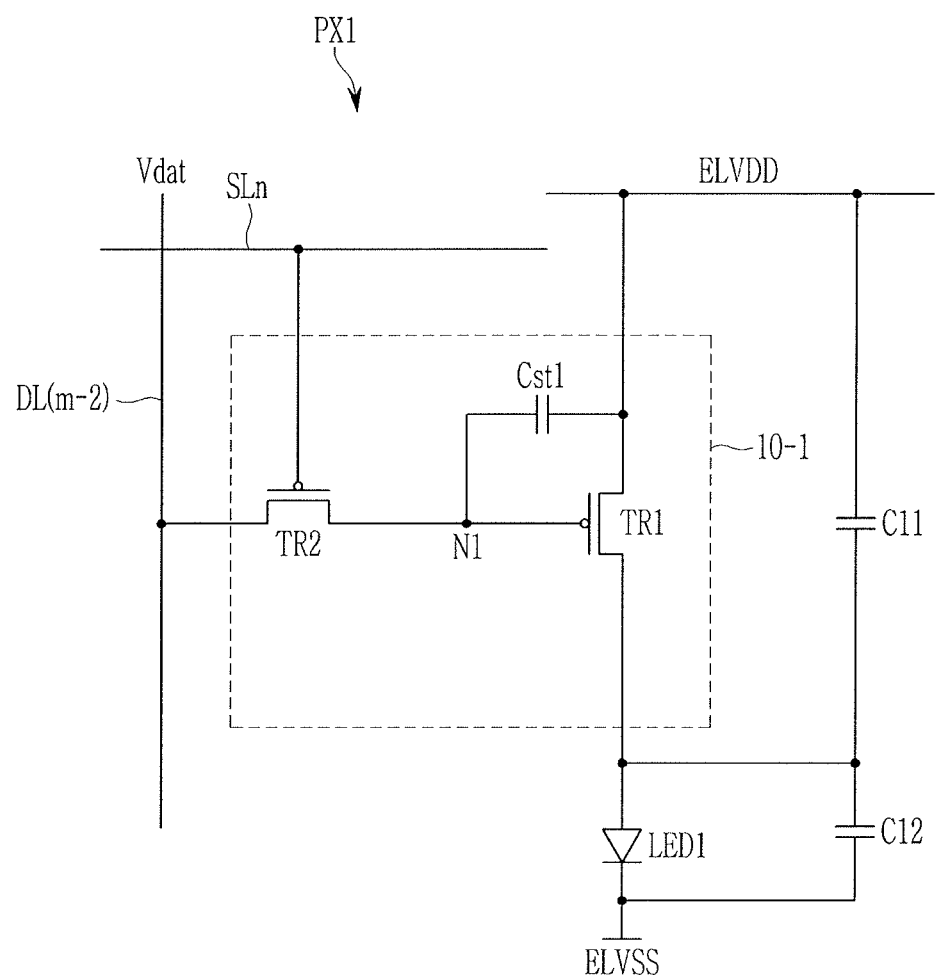
FIG. 6 illustrates a view of one example of a pixel circuit included in FIG. 2 to FIG. 5.

FIG. 6 is a view showing one example of a pixel circuit included in FIG. 2 to FIG. 5. Referring to FIG. 6, a pixel circuit 10-1 according to an exemplary embodiment includes a driving transistor TR1, a switching transistor TR2, and a storage capacitor Cst1. Since the pixel circuit 10-1 of FIG. 6 does not require the second gate line SLIn, the third gate line SLBn, and the emission control line ELn, the second gate line SLIn, the third gate line SLBn, and the emission control line ELn are not connected to the pixel circuit 10-1.

The driving transistor TR1 includes a gate electrode connected to a first node N1, the first electrode connected to the first power source voltage ELVDD, and a second electrode connected to the anode of the first light emitting diode (LED) LED1 (the second light emitting diode (LED) LED2 in the second pixel (PX2, PX2'), the third light emitting diode (LED) LED3 of the third pixel PX3). The driving transistor TR1 may control the current flowing from the first power source voltage ELVDD to the first light emitting diode (LED) LED1 depending on the voltage of the first node N1.

The switching transistor TR2 includes a gate electrode connected to a first gate line SLn, a first electrode connected to the first data line DL(m-2) (the second data line DL(m-1) in the second pixel (PX2, PX2'), the third data line DLm in the third pixel PX3), and a second electrode connected to the first node N1. The switching transistor TR2 is turned on by the first gate signal of the gate-on voltage applied to the first gate line SLn such that the data voltage Vdat applied to the first data line DL(m-2) may be transmitted to the first node N1.

The storage capacitor Cst1 includes a first electrode connected to the first power source voltage ELVDD and a second electrode connected to the first node N1. The storage capacitor Cst1 may maintain the data voltage Vdat transmitted to the first node N1 while the first light emitting diode (LED) LED1 emits light.

The driving transistor TR1 and the switching transistor TR2 may each be a p-channel electric field effect transistor. A gate-on voltage for turning on the p-channel electric field effect transistor is a low level voltage and a gate-off voltage for turning off the p-channel electric field effect transistor is a high level voltage. According to an exemplary embodiment, at least one of the driving transistor TR1 and the switching transistor TR2 may be an n-channel electric field effect transistor. A gate-on voltage for turning on the n-channel electric field effect transistor is a high level voltage, and a gate-off voltage for turning off the n-channel electric field effect transistor is a low level voltage.

Figure 7:
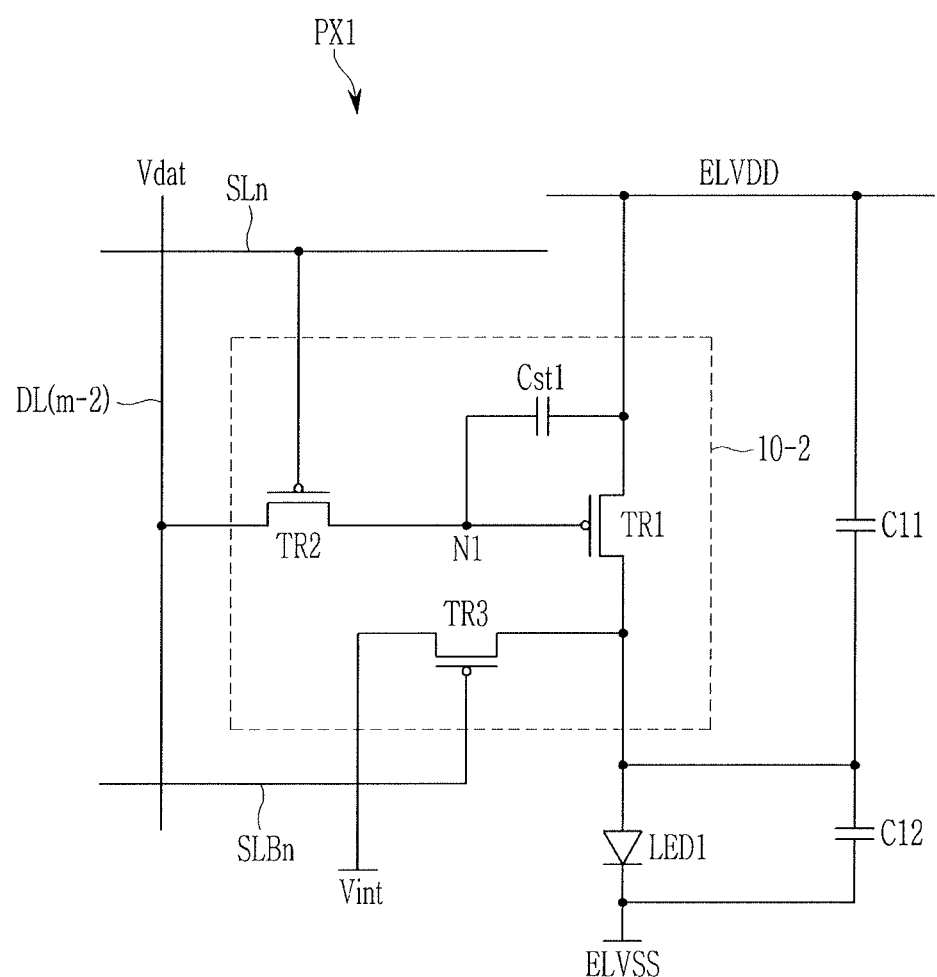
FIG. 7 illustrates a view showing another example of a pixel circuit included in FIG. 2 to FIG. 5.

FIG. 7 is a view showing another example of a pixel circuit included in FIG. 2 to FIG. 5. Referring to FIG. 7, a pixel circuit 10-2 according to another exemplary embodiment includes the driving transistor TR1, the switching transistor TR2, the reset transistor TR3, and the storage capacitor Cst1. Since the pixel circuit 10-2 of FIG. 7 does not require the second gate line SLIn and the emission control line ELn, the second gate line SLIn and the emission control line ELn are not connected to the pixel circuit 10-2. Compared with the pixel circuit 10-1 of FIG. 6, the pixel circuit 10-2 of FIG. 7 further includes a reset transistor TR3.

The reset transistor TR3 includes a gate electrode connected to the third gate line SLBn, a first electrode connected to the initialization voltage Vint, and a second electrode connected to the anode of the first light emitting diode (LED) LED1 (the second light emitting diode (LED) LED2 in the second pixel (PX2, PX2), the third light emitting diode (LED) LED3 in the third pixel PX3). The reset transistor TR3 is turned on by the third gate signal of the gate-on voltage applied to the third gate line SLBn such that the initialization voltage Vint is transmitted to the first light emitting diode (LED) LED1, and the anode voltage of the first light emitting diode (LED) LED1 may be reset to the initialization voltage Vint. The reset transistor TR3 may be the p-channel electric field effect transistor. Also, according to an exemplary embodiment, the reset transistor TR3 may be the n-channel electric field effect transistor.

The characteristics of the driving transistor TR1, the switching transistor TR2, and the storage capacitor Cst1 are the same as described in FIG. 6 such that the description thereof is omitted.

Figure 8:
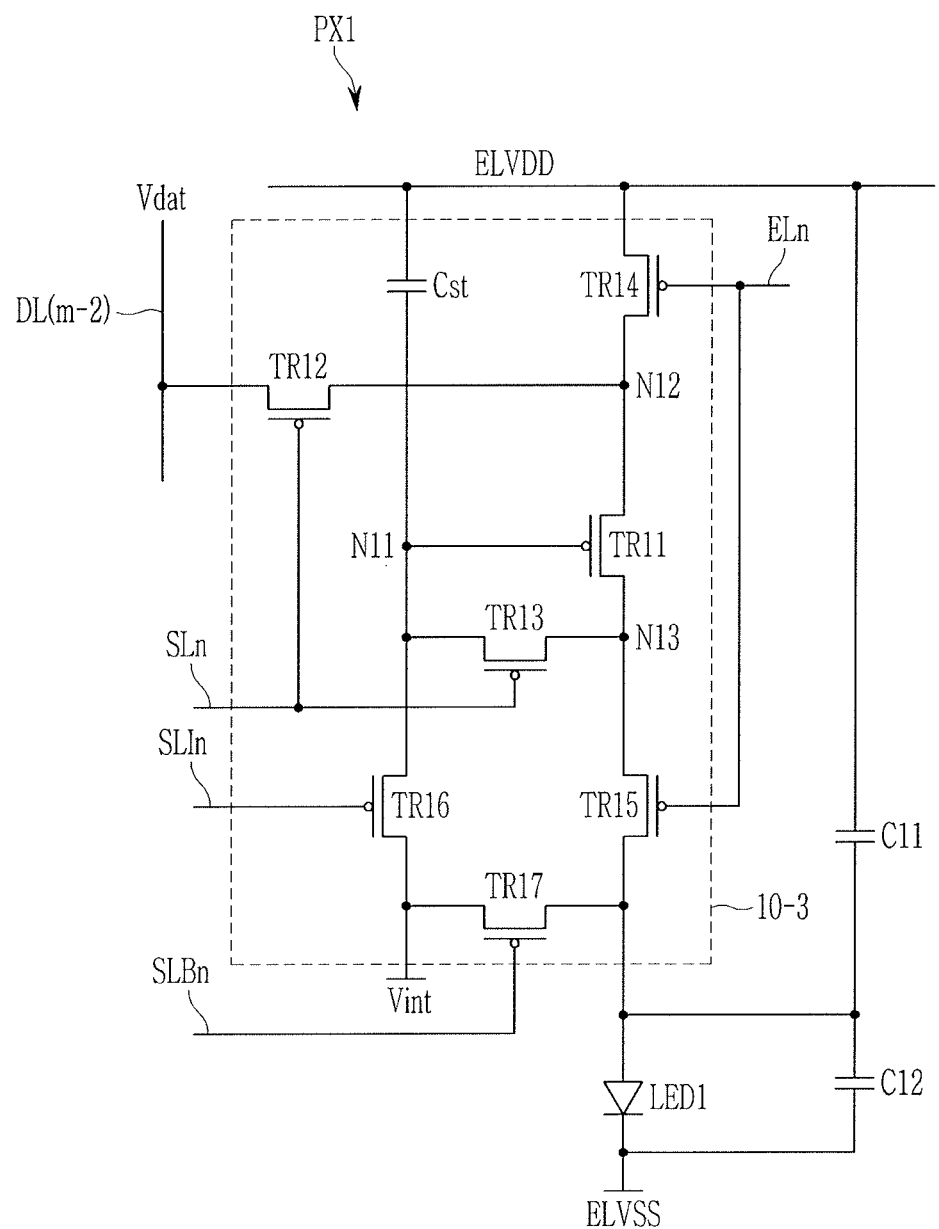
FIG. 8 illustrates a view of another example of a pixel circuit included in FIG. 2 to FIG. 5.

FIG. 8 is a view showing another example of a pixel circuit included in FIG. 2 to FIG. 5. Referring to FIG. 8, a pixel circuit 10-3 according to another exemplary embodiment includes a driving transistor TR11, a switching transistor TR12, a compensation transistor TR13, a first emission control transistor TR14, a second emission control transistor TR15, an initialization transistor TR16, a reset transistor TR17, and a storage capacitor Cst.

The driving transistor TR11 includes a gate electrode connected to the first node N11, a first electrode connected to the second node N12, and a second electrode connected to the third node N13. The driving transistor TR11 is connected between the first power source voltage ELVDD and the first light emitting diode (LED) LED1 (the second light emitting diode (LED) LED2 in the second pixel (PX2, PX2'), the third light emitting diode (LED) LED3 in the third pixel PX3), and may control the current flowing from the first power source voltage ELVDD to the first light emitting diode (LED) LED1 by corresponding to the voltage of the first node N11.

The switching transistor TR12 includes a gate electrode connected to the first gate line SLn, a first electrode connected to the first data line DL(m−2) (the second data line DL (m−1) in the second pixel (PX2. PX2'), the third data line DLm in the third pixel PX3), and a second electrode connected to the second node N12. The switching transistor TR12 is connected between the first data line DL(m−2) and the driving transistor TR11, and is turned on according to the first gate signal of the gate-on voltage applied to the first gate line SLn, thereby transmitting the data voltage Vdat applied to the first data line DL(m−2) to the second node N12.

The compensation transistor TR13 includes a gate electrode connected to the first gate line SLn, a first electrode connected to the third node N13, and a second electrode connected to the first node N11. The compensation transistor TR13 is connected between the second electrode and the gate electrode of the driving transistor TR11, and is turned on according to the first gate signal of the gate-on voltage applied to the first gate line SLn. The compensation transistor TR13 diode-connects the driving transistor TR11, thereby compensating the threshold voltage of the driving transistor TR11. The data voltage in which the threshold voltage of the driving transistor TR11 is compensated is transmitted to the first node N11.

The first emission control transistor TR14 includes a gate electrode connected to the emission control line ELn, a first electrode connected to the first power source voltage ELVDD, and a second electrode connected to the second node N12. The first emission control transistor TR14 is connected between the first power source voltage ELVDD and the driving transistor TR11, and is turned on according to the emission control signal of the gate-on voltage applied to the emission control line ELn, thereby transmitting the first power source voltage ELVDD to the driving transistor TR11.

The second emission control transistor TR15 includes a gate electrode connected to the emission control line ELn, a first electrode connected to the third node N13, and a second electrode connected to the anode of the first light emitting diode (LED) LED1. The second emission control transistor TR15 is connected between the driving transistor TR11 and the first light emitting diode (LED) LED1 and is turned on according to the emission control signal of the gate-on voltage applied to the emission control line ELn, thereby transmitting the current flowing through the driving transistor TR11 to the first light emitting diode (LED) LED1.

The initialization transistor TR16 includes a gate electrode connected to the second gate line SLln, a first electrode connected to the initialization voltage Vint, and a second electrode connected to the first node N11. The initialization transistor TR16 is connected between the gate electrode of the driving transistor TR11 and the initialization voltage Vint, and is turned on by the second gate signal of the gate-on voltage applied to the second gate line SLln. The initialization transistor TR16 may transmit the initialization voltage Vint to the first node N11 to initialize the gate voltage of the driving transistor TR11 to the initialization voltage Vint.

The reset transistor TR17 includes a gate electrode connected to the third gate line SLBn, a first electrode connected to the initialization voltage Vint, and a second electrode connected to the anode of the first light emitting diode (LED) LED1. The reset transistor TR17 is connected between the anode of the first light emitting diode (LED) LED1 and the initialization voltage Vint, and is turned on by the third gate signal of the gate-on voltage applied to the third gate line SLBn. The reset transistor TR17 may transmit the initialization voltage Vint to the anode of the first light emitting diode (LED) LED1 to reset the first light emitting diode (LED) LED1 as the initialization voltage Vint. When the first light emitting diode (LED) LED1 is reset to the initialization voltage Vint, the first capacitor C11 (the second capacitor C21 in the second pixel PX2, the third capacitor C31 in the third pixel PX3) may also be reset to the initialization voltage Vint.

The driving transistor TR11, the switching transistor TR12, the compensation transistor TR13, the first emission control transistor TR14, the second emission control transistor TR15, the initialization transistor TR16, and the reset transistor TR17 may each be the p-channel electric field effect transistor. According to the exemplary embodiment, at least one among the driving transistor TR11, the switching transistor TR12, the compensation transistor TR13, the first emission control transistor TR14, the second emission control transistor TR15, the initialization transistor TR16, and the reset transistor TR17 may be the n-channel electric field effect transistor.

The storage capacitor Cst includes a first electrode connected to the first power source voltage ELVDD and a second electrode connected to the first node N11. The data voltage of which the threshold voltage of the driving transistor TR11 is compensated is transmitted to the first node N11, and the storage capacitor Cst may have a function of maintaining the voltage of the first node N11.

The first electrode of the first capacitor C11 (the second capacitor C21 in the second pixel PX2, the third capacitor C31 in the third pixel PX3) may be connected to the first power source voltage ELVDD, and the second electrode may be connected between the second emission control transistor TR15 and the first light emitting diode (LED) LED1.

As described above, the pixel circuit 10 of FIG. 2 to FIG. 5 may include one of the pixel circuit 10-1 of FIG. 6, the pixel circuit 10-2 of FIG. 7, and the pixel circuit 10-3 of FIG. 8. However, the pixel circuit 10 of FIG. 2 to FIG. 5 is not limited to the pixel circuits 10-1, 10-2, and 10-3 of FIG. 6 to FIG. 8, and may include a predetermined pixel circuit transmitting the current of the light emitting diode (LED).

Figure 9:
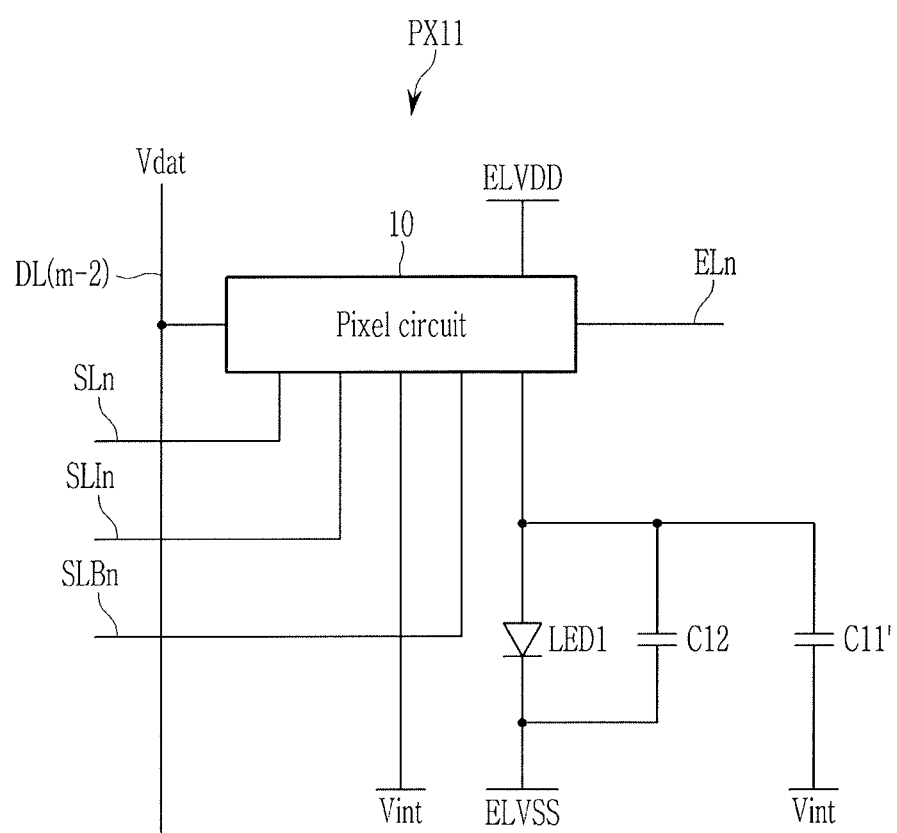
FIG. 9 illustrates a view of a first pixel according to another exemplary embodiment.
Figure 10:
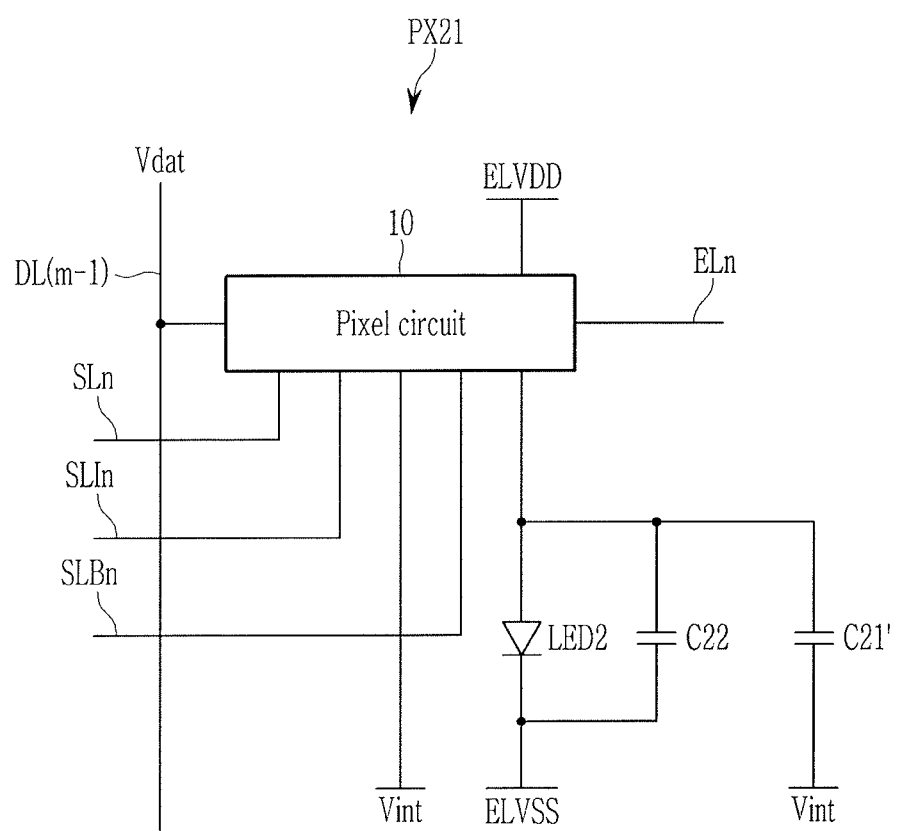
FIG. 10 illustrates a view of a second pixel according to another exemplary embodiment.
Figure 11:
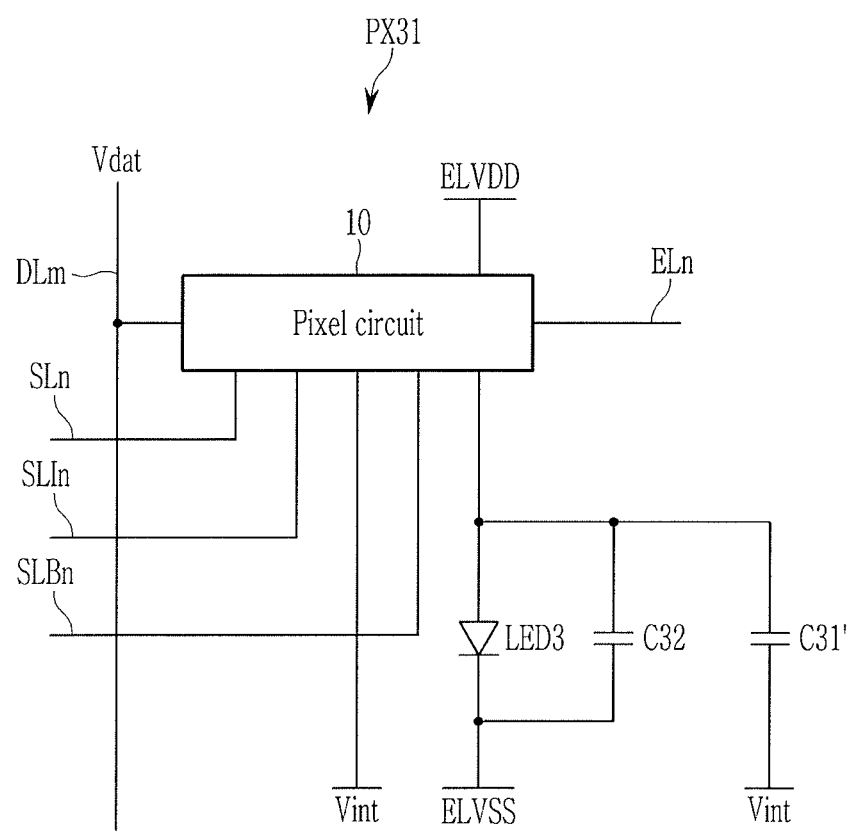
FIG. 11 illustrates a view of a third pixel according to another exemplary embodiment.

Next, the first pixel, the second pixel, and the third pixel according to another exemplary embodiment are described with reference to FIG. 9 to FIG. 11. Differences are mainly described compared with the first pixel, the second pixel, and the third pixel according to the exemplary embodiment of FIG. 2 to FIG. 4. FIG. 9 is a view showing a first pixel PX11 according to another exemplary embodiment. FIG. 10 is a view showing a second pixel PX21 according to another exemplary embodiment. FIG. 11 is a view showing a third pixel PX31 according to another exemplary embodiment.

Referring to FIG. 9, the first pixel PX11 at the n-th pixel row and the (m−2)-th pixel column in the display device of FIG. 1 is described as an example. The first pixel PX11 according to another exemplary embodiment includes the first light emitting diode (LED) LED1, the pixel circuit 10, and a first capacitor C11'.

The first capacitor C11' includes a first electrode connected to the initialization voltage Vint and a second electrode connected to the anode of the first light emitting diode (LED) LED1. When the current starts to flow to the first light emitting diode (LED) LED1 though the pixel circuit 10, the time that the anode voltage of the first light emitting diode (LED) LED1 reaches the threshold voltage may be delayed by the time that it takes for the first capacitor C11' to be charged. Accordingly the emission timing of the first light emitting diode (LED) LED1 may be controlled according to the capacitance of the first capacitor C11'.

Except for these differences, the characteristics of the exemplary embodiment described with reference to FIG. 2 may all be applied to the exemplary embodiment described with reference to FIG. 9 such that the overlapping descriptions between the exemplary embodiments are omitted.

The second pixel PX21 at the n-th pixel row and the (m−1)-th pixel column in the display device of FIG. 1 is described with reference to FIG. 10. The second pixel PX21 according to another exemplary embodiment includes the second light emitting diode (LED) LED2, the pixel circuit 10, and a second capacitor C21'.

The second capacitor C21' includes a first electrode connected to the initialization voltage Vint and a second electrode connected to the anode of the second light emitting diode (LED) LED2. When the current starts to flow to the second light emitting diode (LED) LED2 through the pixel circuit 10, the time that the anode voltage of the second light emitting diode (LED) LED2 reaches the threshold voltage may be delayed by the time that it takes for the second capacitor C21' to be charged, and accordingly the emission timing of the second light emitting diode (LED) LED2 may be controlled according to the capacitance of the second capacitor C21'.

Except for these differences, the characteristics of the exemplary embodiment described with reference to FIG. 3 may all be applied to the exemplary embodiment described with reference to FIG. 10 such that the overlapping descriptions between the exemplary embodiments are omitted.

Referring to FIG. 11, the third pixel PX31 positioned at the n-th pixel row and the m-th pixel column among the plurality of pixels PX included in the display device of FIG. 1 is described as an example. The third pixel PX31 according to another exemplary embodiment includes the third light emitting diode (LED) LED3, the pixel circuit 10, and a third capacitor C31'.

The third capacitor C31' includes a first electrode connected to the initialization voltage Vint and a second electrode connected to the anode of the third light emitting diode (LED) LED3. When the current starts to flow to the third light emitting diode (LED) LED3 through the pixel circuit 10, the time that the anode voltage of the third light emitting diode (LED) LED3 reaches the threshold voltage may be delayed by the time that it takes for the third capacitor C31' to be charged, and accordingly the emission timing of the third light emitting diode (LED) LED3 may be controlled according to the capacitance of the third capacitor C31'.

Except for these differences, the characteristics of the exemplary embodiment described with reference to FIG. 4 may all be applied to the exemplary embodiment described with reference to FIG. 11 such that the overlapping descriptions between the exemplary embodiments are omitted.

Referring to FIG. 9 to FIG. 11, the capacitance of the second capacitor C21' of the second pixel PX21 is less than the capacitance of the first capacitor C11' of the first pixel PX11. Also, the capacitance of the second capacitor C21' of the second pixel PX21 is less than the capacitance of the third capacitor C31' of the third pixel PX31. The capacitance of the first capacitor C11' of the first pixel PX11 may be less than the capacitance of the third capacitor C31' of the third pixel PX31.

The first capacitor C11' of the first pixel PX11 of FIG. 9 may have the same function as the first capacitor C11 of the first pixel PX1 of FIG. 2, the second capacitor C21' of the second pixel PX21 of FIG. 10 may have the same function as the second capacitor C21 of the second pixel PX2 of FIG. 3, and the third capacitor C31' of the third pixel PX31 of FIG. 11 may have the same function as the third capacitor C31 of the third pixel PX3 of FIG. 4. Accordingly, as above-described in FIG. 2 to FIG. 4, by appropriately controlling the capacitance of the first capacitor C11', the second capacitor C21', and the third capacitor C31', the emission timings of the first pixel PX11, the second pixel PX21, and the third pixel PX31 of FIG. 9 to FIG. 11 may be matched.

Alternatively, the plurality of pixels PX may include the first pixel PX11 of FIG. 9, the second pixel PX2' of FIG. 5, and the third pixel PX31 of FIG. 11. Even in such a case, by appropriately controlling the capacitance of the first capacitor C11' of the first pixel PX11 and the third capacitor C31' of the third pixel PX31, the emission timings of the first pixel PX11, the second pixel PX2', and the third pixel PX31 may be matched.

Next, the exemplary embodiments of the pixel circuit 10 included in FIG. 9 to FIG. 11 are described with reference to FIG. 12 to FIG. 14. The pixel circuit 10 is described as an example of the first pixel PX11. The pixel circuit 10 included in the second pixel PX21 and the third pixel PX31 is the same as the pixel circuit 10 included in the first pixel PX11 such that the description for the pixel circuit 10 included in the second pixel PX21 and the third pixel PX31 is omitted.

Figure 12:
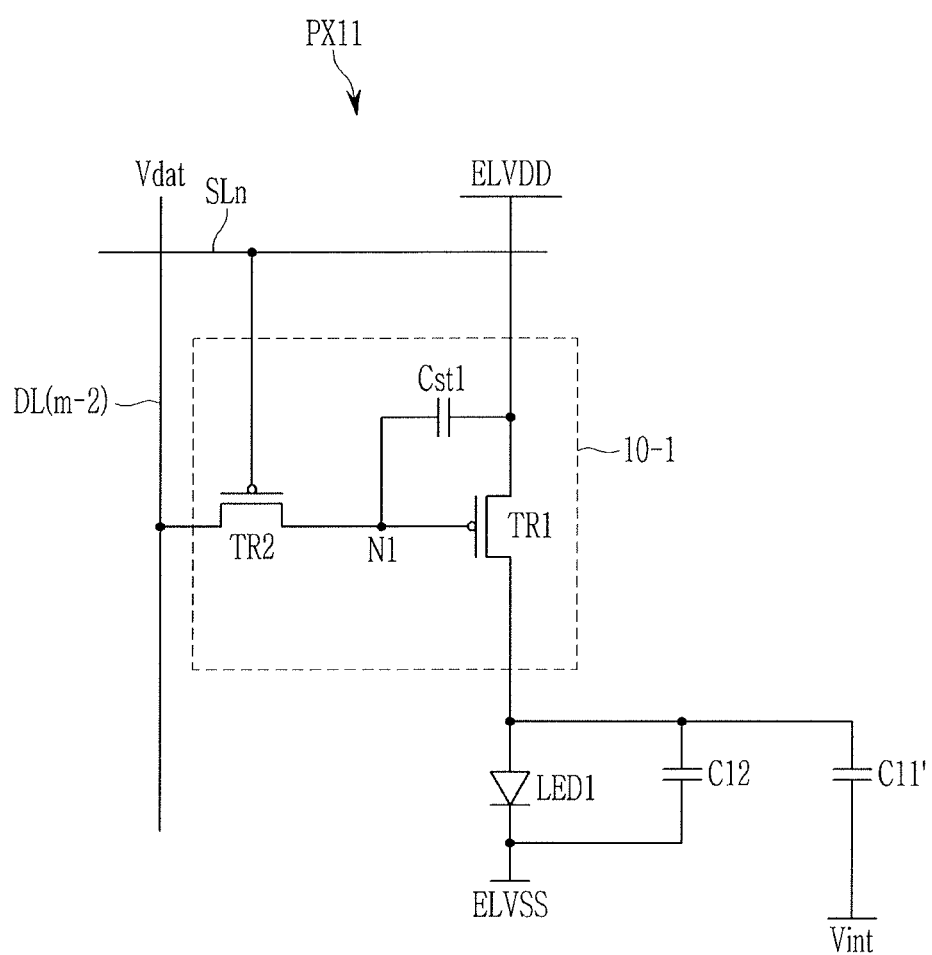
FIG. 12 illustrates a view of one example of a pixel circuit included in FIG. 9 to FIG. 11.

FIG. 12 is a view showing one example of a pixel circuit included in FIG. 9 to FIG. 11. FIG. 13 is a view showing another example of a pixel circuit included in FIG. 9 to FIG. 11. FIG. 14 is a view showing another example of a pixel circuit included in FIG. 9 to FIG. 11.

The pixel circuit 10-1 of FIG. 12 is the same as the pixel circuit 10-1 above-described in FIG. 6. However, the first electrode of the first capacitor C11' (the second capacitor C21' in the second pixel PX21 and the third capacitor C31' in the third pixel PX31) having the second electrode connected between the pixel circuit 10-1 and the first light emitting diode (LED) LED1 (the second light emitting diode (LED) LED2 in the second pixel PX21 and the third light emitting diode (LED) LED3 in the third pixel PX31) is connected to the initialization voltage Vint in FIG. 12, rather than to the first power source voltage ELVDD.

Figure 13:
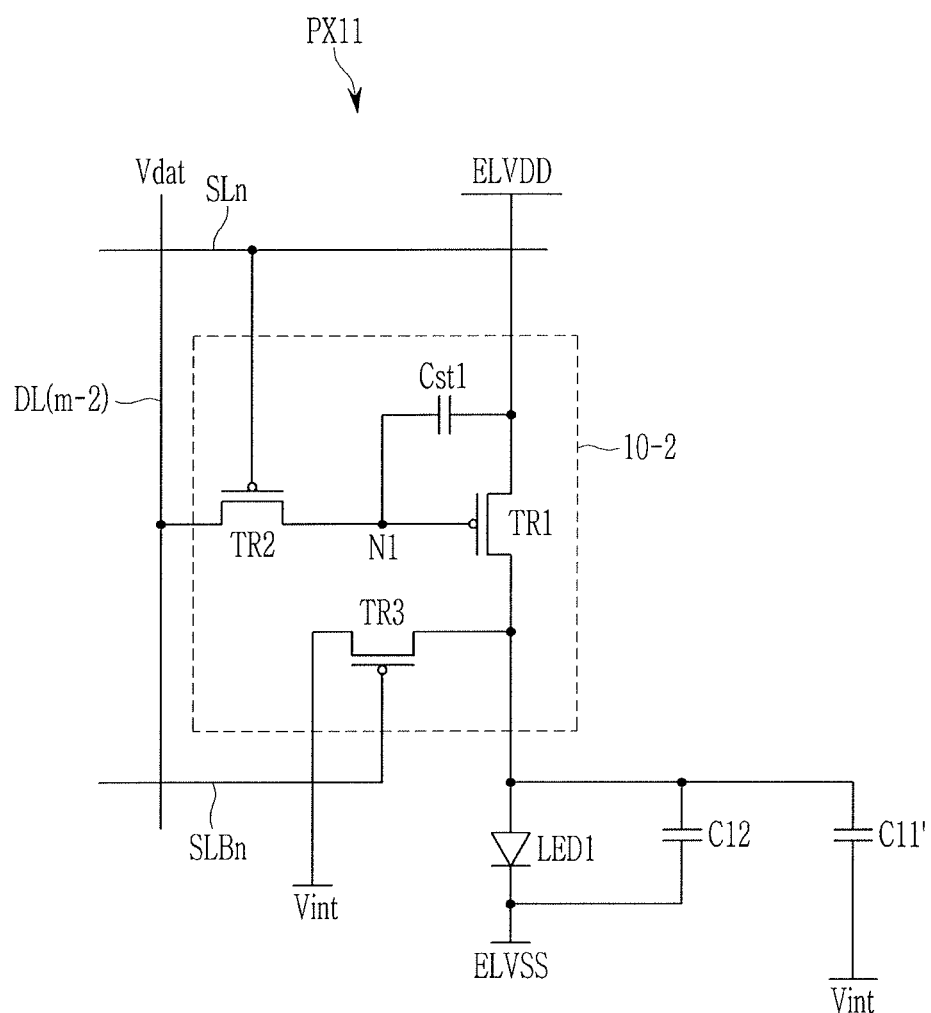
FIG. 13 illustrates a view of another example of a pixel circuit included in FIG. 9 to FIG. 11.

The pixel circuit 10-2 of FIG. 13 is the same as the pixel circuit 10-2 described in FIG. 7. However, the first electrode of the first capacitor C11' (the second capacitor C21' in the second pixel PX21 and the third capacitor C31' in the third pixel PX31) having the second electrode connected between the pixel circuit 10-2 and the first light emitting diode (LED) LED1 (the second light emitting diode (LED) LED2 in the second pixel PX21 and the third light emitting diode (LED) LED3 in the third pixel PX31) is connected to the initialization voltage Vint in FIG. 13, rather than to the first power source voltage ELVDD.

Figure 14:
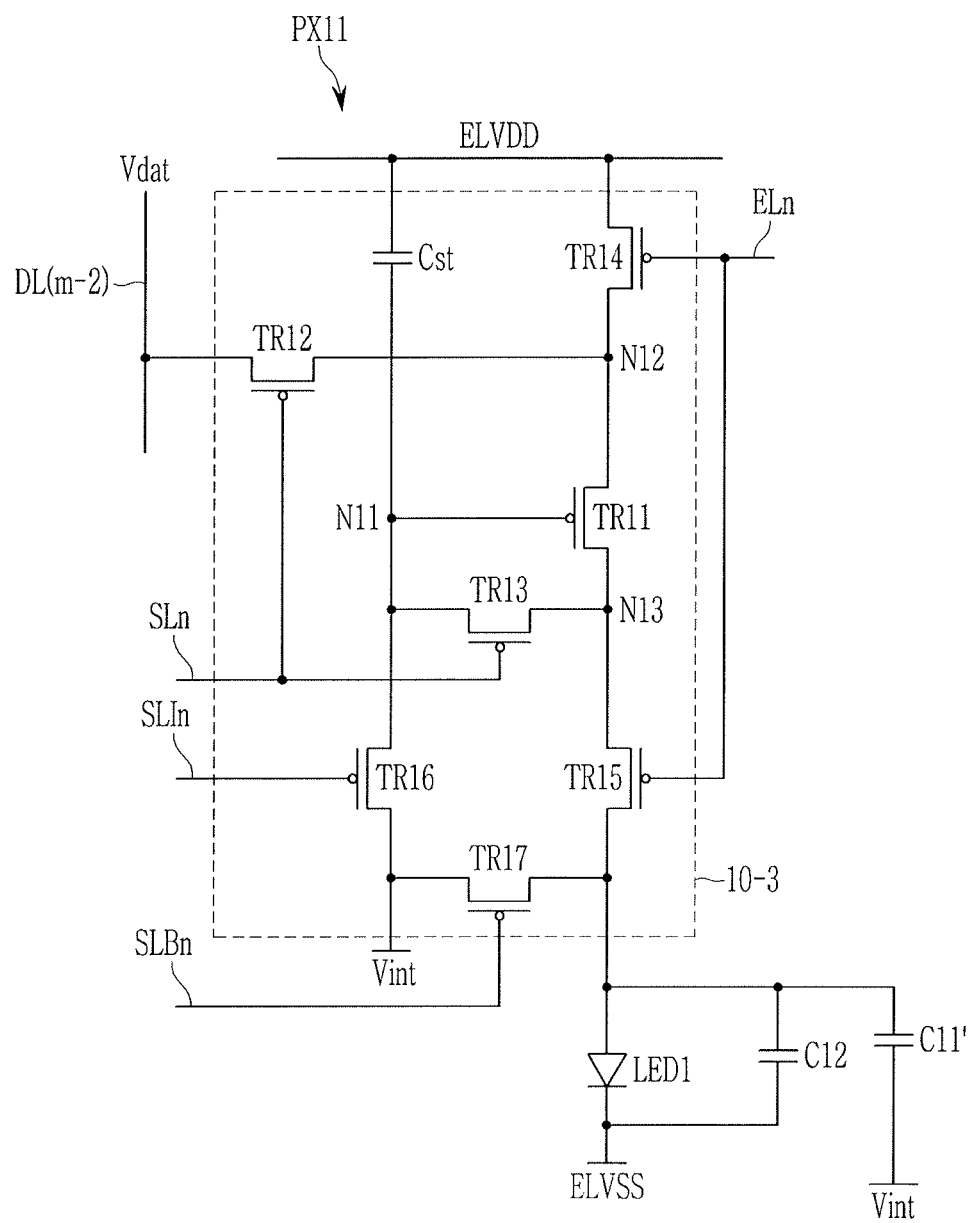
FIG. 14 illustrates a view of another example of a pixel circuit included in FIG. 9 to FIG. 11.

The pixel circuit 10-3 of FIG. 14 is the same as the pixel circuit 10-3 described in FIG. 8. However, the first electrode of the first capacitor C11' (the second capacitor C21' in the second pixel PX21 and the third capacitor C31' in the third pixel PX31) having the second electrode connected between the second emission control transistor TR15 and the first light emitting diode (LED) LED1 (the second light emitting diode (LED) LED2 in the second pixel PX21 and the third light emitting diode (LED) LED3 in the third pixel PX31) is connected to the initialization voltage Vint in FIG. 14, rather than to the first power source voltage ELVDD.

The pixel circuit 10 of FIG. 9 to FIG. 11 may include one among the pixel circuit 10-1 of FIG. 12, the pixel circuit 10-2 of FIG. 13, and the pixel circuit 10-3 of FIG. 14. However, the pixel circuit 10 of FIG. 9 to FIG. 11 is not limited to the pixel circuits 10-1, 10-2, and 10-3 of FIG. 12 to FIG. 14, and may include a predetermined pixel circuit capable of providing the current to the light emitting diode (LED).

Figure 15:
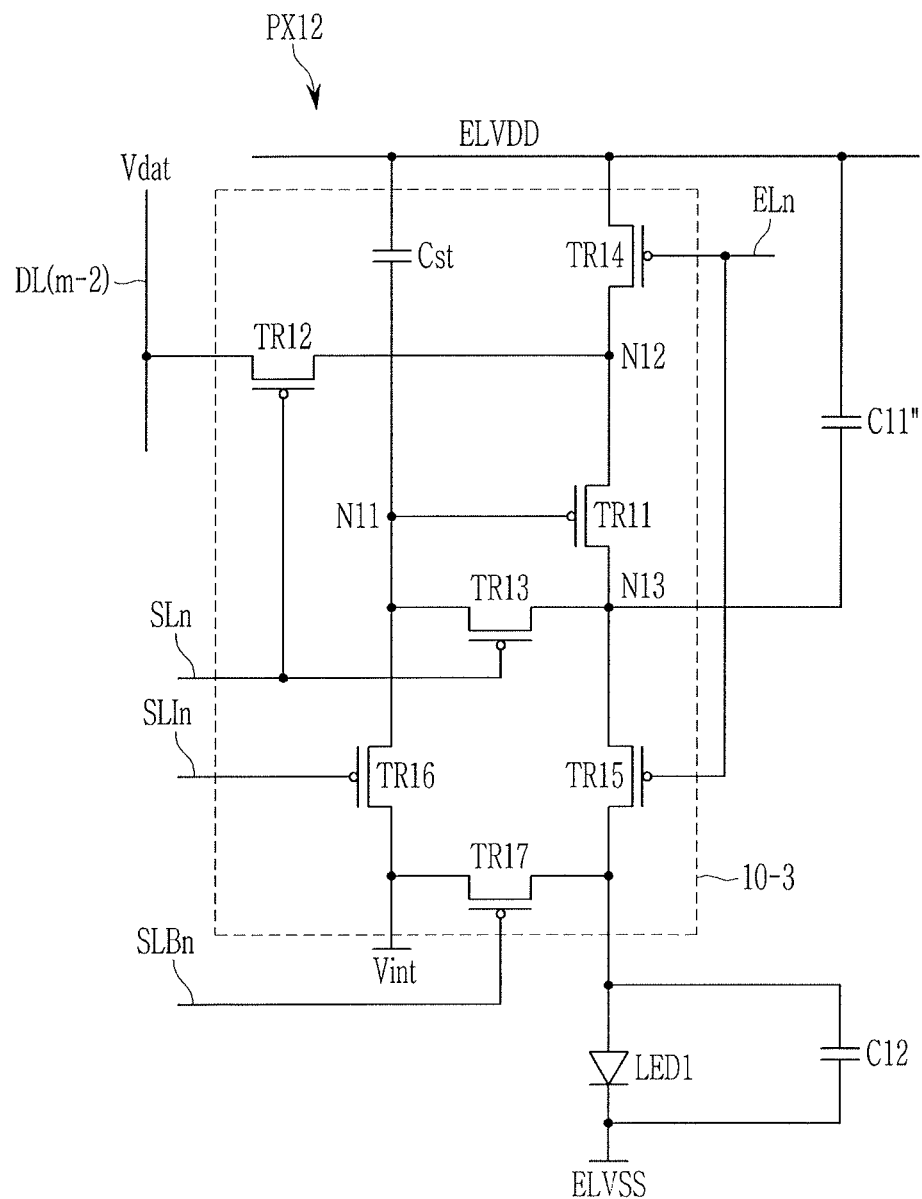
FIG. 15 illustrates a view of a first pixel according to another exemplary embodiment.
Figure 16:
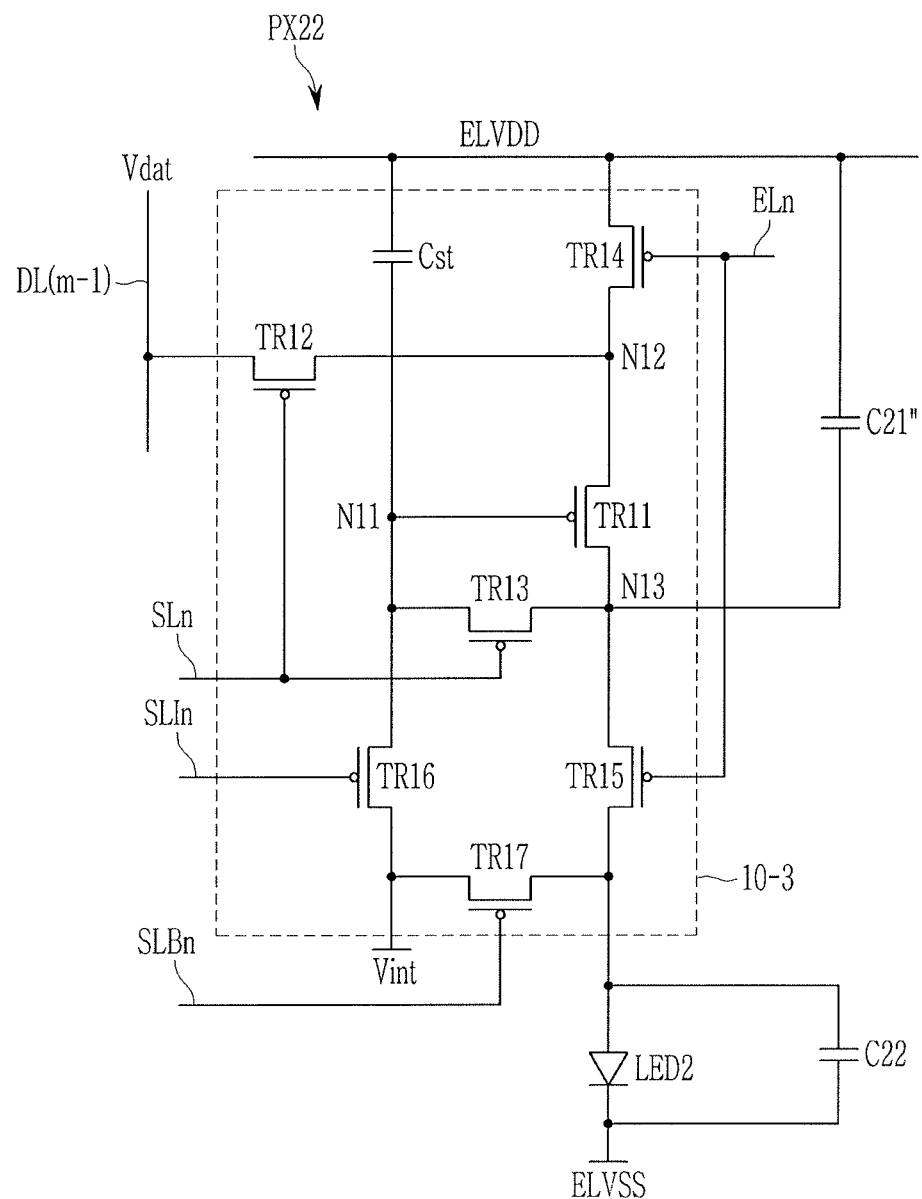
FIG. 16 illustrates a view of a second pixel according to another exemplary embodiment.
Figure 17:
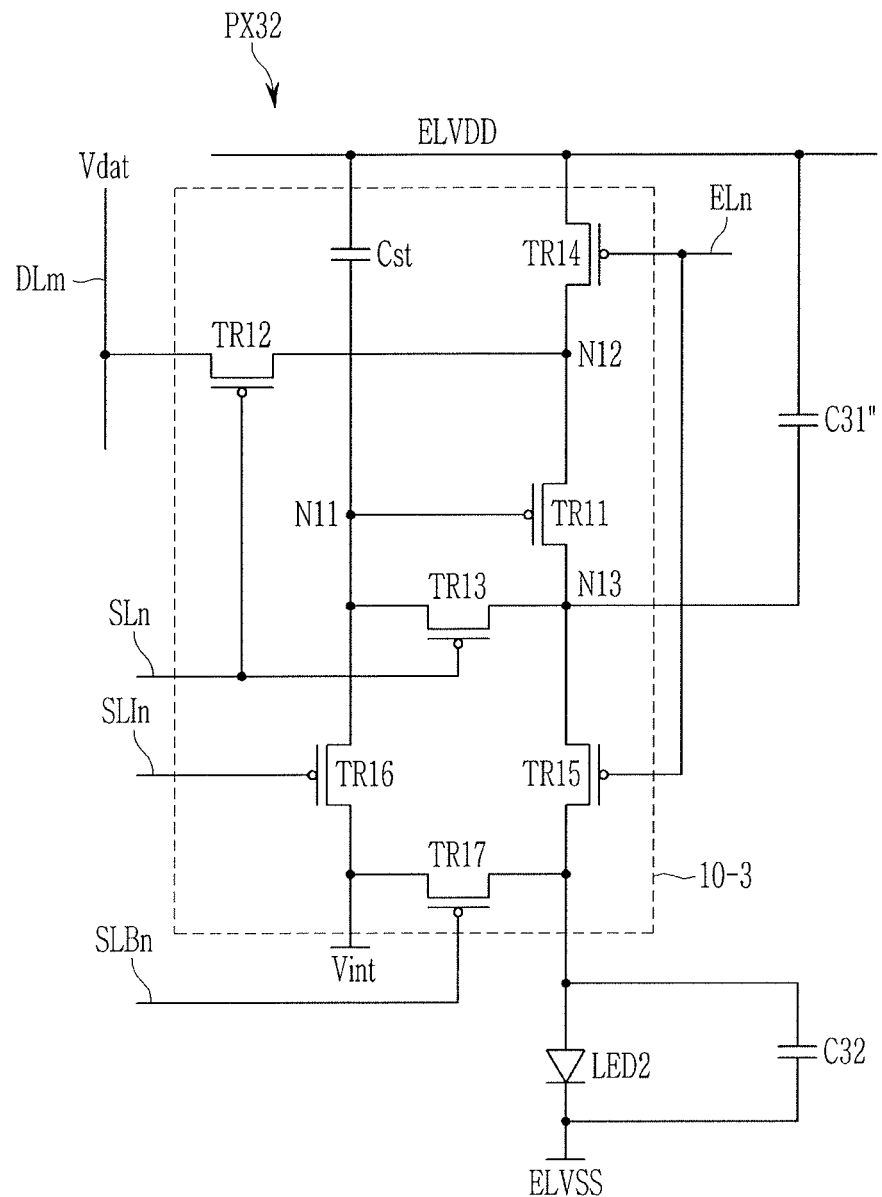
FIG. 17 illustrates a view of a third pixel according to another exemplary embodiment.

Next, the first pixel, the second pixel, and the third pixel according to another exemplary embodiment are described with reference to FIG. 15 to FIG. 17. FIG. 15 is a view showing a first pixel PX12 according to another exemplary embodiment. FIG. 16 is a view showing a second pixel PX22 according to another exemplary embodiment. FIG. 17 is a view showing a third pixel PX32 according to another exemplary embodiment.

FIG. 15 illustrates the first pixel PX12 at the n-th pixel row and the (m−2)-th pixel column. FIG. 16 illustrates the second pixel PX22 at the n-th pixel row and the (m−1)-th pixel column. FIG. 17 illustrates the third pixel PX32 at the n-th pixel row and the m-th pixel column among the plurality of pixels PX.

The first pixel PX12 of FIG. 15 includes the first light emitting diode (LED) LED1, the pixel circuit 10-3, and the first capacitor C11". The pixel circuit 10-3 of FIG. 15 is the same as the pixel circuit 10-3 described in FIG. 8 such that the detailed description for the pixel circuit 10-3 of FIG. 15 is omitted. The first capacitor C11" includes the first electrode connected to the first power source voltage ELVDD and the second electrode connected a the third node N13 That is, the second electrode of the first capacitor C11" is connected between the driving transistor TR11 and the second emission control transistor TR15. Compared with FIG. 8, the second electrode of the first capacitor C11" of FIG. 15 is connected to the third node N13, rather than directly to the anode of the first light emitting diode (LED) LED1. When the second emission control transistor TR15 is turned on, the third node N13 is connected to the anode of the first light emitting diode (LED) LED1, and in this case, the first capacitor C11" may control the emission timing of the first light emitting diode (LED) LED1.

The second pixel PX22 of FIG. 16 includes the second light emitting diode (LED) LED2, the pixel circuit 10-3, and the second capacitor C21". The pixel circuit 10-3 of FIG. 16 is the same as the pixel circuit 10-3 described in FIG. 8. The second capacitor C21" includes the first electrode connected to the first power source voltage ELVDD and the second electrode connected to the third node N13, rather than directly to the anode of the second light emitting diode (LED) LED2. That is, the second electrode of the second capacitor C21" is connected between the driving transistor TR11 and the second emission control transistor TR15. The second capacitor C21" may control the emission timing of the second light emitting diode (LED) LED2. Alternatively, the second capacitor C21" may be omitted.

The third pixel PX32 of FIG. 17 includes the third light emitting diode (LED) LED3, the pixel circuit 10-3, and the third capacitor C31". The pixel circuit 10-3 of FIG. 17 is the same as the pixel circuit 10-3 described in FIG. 8. The third capacitor C31" includes the first electrode connected to the first power source voltage ELVDD and the second electrode connected to the third node N13, rather than directly to the anode of the third light emitting diode (LED) LED3. That is, the second electrode of the third capacitor C31" is connected between the driving transistor TR11 and the second emission control transistor TR15. The third capacitor C31" may control the emission timing of the third light emitting diode (LED) LED3.

The capacitance of the second capacitor C21" of the second pixel PX22 is less than the capacitance of the first capacitor C11" of the first pixel PX12. Also, the capacitance of the second capacitor C21" of the second pixel PX22 is less than the capacitance of the third capacitor C31" of the third pixel PX32. The capacitance of the first capacitor C11" of the first pixel PX12 may be less than the capacitance of the third capacitor C31" of the third pixel PX32. By appropriately controlling the capacitance of the first capacitor C11", the second capacitor C21", and the third capacitor C31", the emission timings of the first pixel PX12, the second pixel PX22, and the third pixel PX32 may be matched.

One or more embodiments may provide a display device having pixels emitting light of different colors with matching emission timings. Thus, image purity may be enhanced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a light emitting diode including an anode and a cathode;
a driving transistor receiving a first power source voltage and output an output current to the anode of the light emitting diode, the driving transistor to control the output current flowing from the first power source voltage to the anode of the light emitting diode;
a first switching transistor connected between the driving transistor and a data line;
a storage capacitor connected between a gate electrode of the driving transistor and the first power source voltage, the storage capacitor;
a first capacitor connected between the anode and the cathode of the light emitting diode; and
a second capacitor connected between the anode of the light emitting diode and an initialization voltage.

2. The display device as claimed in claim 1, wherein the first switching transistor transmits a data voltage from the data line to the gate electrode of the driving transistor.

3. The display device as claimed in claim 1, further comprising:
a second switching transistor connected to an output electrode of the driving transistor.

4. The display device as claimed in claim 3, wherein the second switching transistor transmits an initialization voltage to the output electrode of the driving transistor.

5. The display device as claimed in claim 4, wherein the first switching transistor transmits a data voltage from the data line to the gate electrode of the driving transistor.

6. The display device as claimed in claim 3, wherein the first switching transistor transmits a data voltage from the data line to an input electrode of the driving transistor.

7. The display device as claimed in claim 6, further comprising:
a third switching transistor connected between an initialization voltage and the gate electrode of the driving transistor.

8. The display device as claimed in claim 7, wherein the second switching transistor is connected between the output electrode of the driving transistor and the gate electrode of the driving transistor.

9. The display device as claimed in claim 8, further comprising:
a fourth switching transistor transmitting the first power source voltage to the driving transistor; and
a fifth switching transistor transmitting the output current of the driving transistor to the anode of the light emitting diode.

10. The display device as claimed in claim 9, further comprising:
a sixth switching transistor transmitting an initialization voltage to the anode of the light emitting diode.

11. A display device, comprising:
a light emitting diode including an anode and a cathode;
a driving transistor receiving a first power source voltage and output an output current to the anode of the light emitting diode, the driving transistor to control the output current flowing from the first power source voltage to the anode of the light emitting diode;
a first switching transistor connected between the driving transistor and a data line;
a storage capacitor connected between a gate electrode of the driving transistor and the first power source voltage, the storage capacitor;
a first capacitor connected between the anode and the cathode of the light emitting diode; and
a second capacitor connected between an output electrode of the driving transistor and the first power source voltage.

12. The display device as claimed in claim 11, wherein the first switching transistor transmits a data voltage from the data line to an input electrode of the driving transistor.

13. The display device as claimed in claim 12, further comprising:
a second switching transistor connected between the output electrode of the driving transistor and the gate electrode of the driving transistor.

14. The display device as claimed in claim 13, further comprising:
a third switching transistor connected between an initialization voltage and the gate electrode of the driving transistor.

15. The display device as claimed in claim 14, wherein the second switching transistor is connected between the output electrode of the driving transistor and the gate electrode of the driving transistor.

16. The display device as claimed in claim 15, further comprising:
a fourth switching transistor transmitting the first power source voltage to the driving transistor; and
a fifth switching transistor transmitting the output current of the driving transistor to the anode of the light emitting diode.

17. The display device as claimed in claim 16, further comprising:
a sixth switching transistor transmitting an initialization voltage to the anode of the light emitting diode.

18. The display device as claimed in claim 11, wherein a capacitance of the second capacitor disposed in a first pixel is less than a capacitance of a corresponding second capacitor disposed in a second pixel adjacent to the first pixel.

19. The display device as claimed in claim 18, wherein the first pixel emits red light or blue light, and the second pixel emits green light.

* * * * *